(12) United States Patent
Lammers et al.

(10) Patent No.: US 6,496,423 B2
(45) Date of Patent: Dec. 17, 2002

(54) CHIP ID REGISTER CONFIGURATION

(75) Inventors: Stefan Lammers, München (DE); Zoltan Manyoki, Kanata (CA)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/898,261

(22) Filed: Jul. 3, 2001

(65) Prior Publication Data

US 2002/0021590 A1 Feb. 21, 2002

(30) Foreign Application Priority Data

Jul. 3, 2000 (DE) .......................... 100 32 256

(51) Int. Cl.$^7$ ................................ G11C 7/00
(52) U.S. Cl. .................. 365/189.12; 365/96; 365/103; 365/236
(58) Field of Search .............. 365/96, 103, 189.12, 365/221, 236, 233

(56) References Cited

U.S. PATENT DOCUMENTS

| | | |
|---|---|---|
| 5,079,725 A | 1/1992 | Geer et al. |
| 5,155,732 A * | 10/1992 | Jarwala et al. ........... 324/158.1 |
| 5,737,587 A | 4/1998 | Leung et al. |
| 5,799,080 A | 8/1998 | Padmanabhan et al. |

FOREIGN PATENT DOCUMENTS

| | | | |
|---|---|---|---|
| DE | 19952947 A1 * | 5/2001 | ............ G11C/7/00 |
| EP | 0 285 329 B1 | 10/1988 | |
| EP | 616429 A1 * | 9/1994 | ............ G01R/31/28 |

OTHER PUBLICATIONS

"Fuse Book Offering Redundancy Test Immediately", IBM Technical Disclosure Bulletin, vol. 37, No. 03, Mar. 1994, pp. 283–286.

* cited by examiner

*Primary Examiner*—Richard Elms
*Assistant Examiner*—Vanthu Nguyen
(74) *Attorney, Agent, or Firm*—Laurence A. Greenberg; Werner H. Stemer; Ralph E. Locher

(57) ABSTRACT

A chip ID register configuration includes a shift register having individual stages. A fuse device connected to the shift register has fuses each substantially assigned to a respective one of the individual stages of the shift register, for identifying a chip having various required and non-required categories. The fuse device stores information from the categories to be read out serially through the shift register to identify the chip. A memory unit stores items of defined information. A logic circuit reads the fuse device for the required category and reads one of the items of defined information stored in the memory unit for the non-required category, on the basis of the categories of the chip to be identified. Standard testing of different chips is made possible while taking up little chip area.

4 Claims, 3 Drawing Sheets

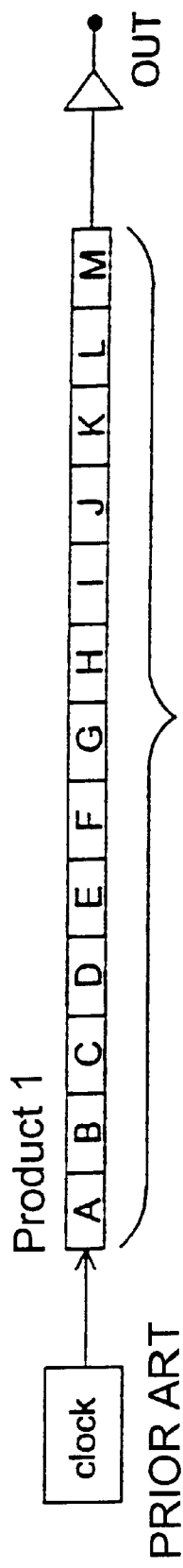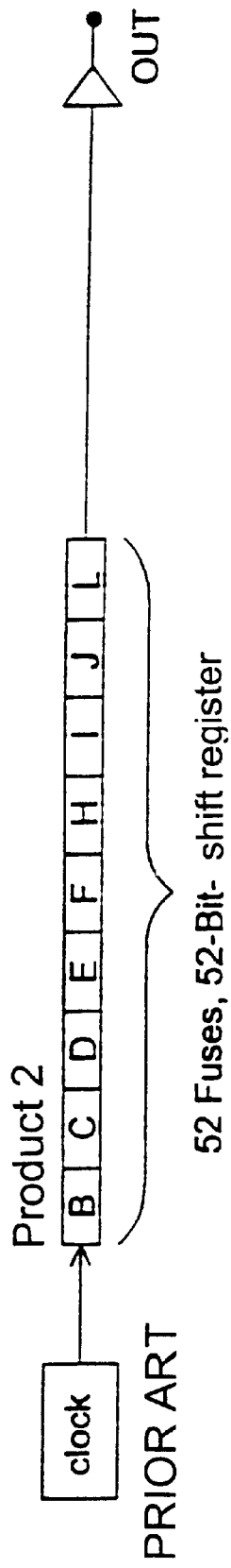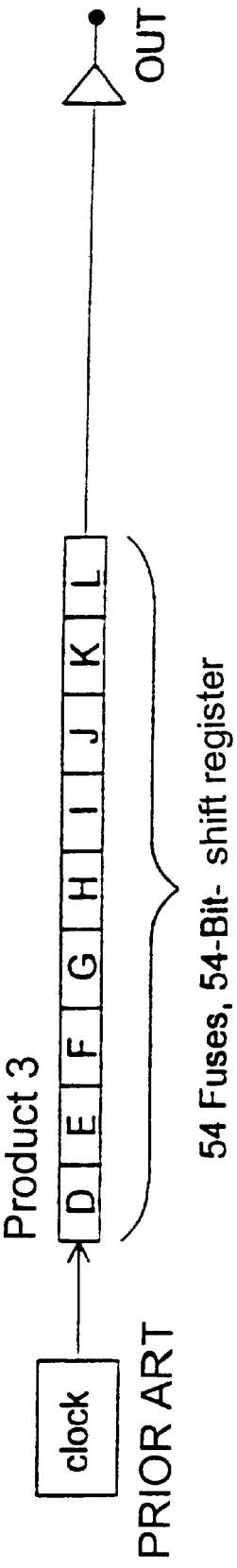

CHIP ID REGISTER CONFIGURATION

BACKGROUND OF THE INVENTION

Field of the Invention

The present invention relates to a chip ID (identification) register configuration including a shift register and a fuse device connected to the shift register. Individual stages of the shift register are each substantially assigned one fuse in the fuse configuration, in order to identify a chip. It is possible to store information in the fuse device, and to read out the information serially through the shift register to identify the chip.

A chip ID register configuration is implemented in a chip in order to ensure that the chip can be identified accurately. Significant data about the chip, such as its manufacturing site or factory, batch number, design version, etc. is stored in the chip ID register configuration.

Such a chip ID register configuration includes a shift register for n bits and n fuse latches, each of which has a fuse and a latch element and are also referred to in short as "fuses" in the following text. Information bits are programmed into those fuses, for example with the aid of a laser.

The information that is stored in the fuses of the chip ID register configuration, that is to say the significant data about the chip, can be read serially out of the register configuration with the aid of a clock signal during a test of the chip.

Attention also has to be paid to the fact that different information is additionally important for different chips. For example, there are items of information which have to be stored in each chip, such as its serial number or wafer number. Other information only needs to be stored on single chips, such as "split lot information", for example.

One possible structure of a chip ID register configuration is illustrated in the following table. That register configuration includes a total of 74 storable bits, which are subdivided into 13 categories ("field names") A to M, each of which is assigned a significant item of information ("field description"), such as lot number, wafer number, X coordinate, Y coordinate, etc.. Each category A to M has a specific number of bits ("number of bits required"). Contents, for example numbers 0 to 9, and meanings or "comments" assigned to the latter ("comment"), such as a year of manufacture, are stored in further columns.

In each of the figures, categories A to M are intended to illustrate a shift register stage, as well as fuses F connected thereto, as is shown diagrammatically for the category A.

| Field Name | field description | number of bits Required | contents | comment | product 1 | 2 | 3 |
|---|---|---|---|---|---|---|---|
| A | fab & encode level | 4 | | | A | | |
| B | | 5 | A...Z, 3 | 1st char (fab) | B | B | |
| C | | 5 | A...Z | classification | C | C | |
| D | | 4 | 0...9 | year | D | D | D |
| E | lot number | 6 | 1...53 | weak | E | E | E |
| F | | 10 | 0...999 | serial number | F | F | F |
| G | | 7 | 00...99 | split lot info | G | | G |

-continued

| Field Name | field description | number of bits Required | contents | comment | product 1 | 2 | 3 |
|---|---|---|---|---|---|---|---|
| H | wafer number | 6 | 1...50 | | H | H | H |
| I | x coordinate | 6 | 0...63 | | I | I | I |
| J | y coordinate | 6 | 0...63 | | J | J | J |
| K | prefuse sort | 5 | | | K | | K |
| L | design version | 4 | | | L | L | L |
| M | product code | 6 | | | M | | |
| | | | | total bits | 74 | 52 | 54 |

A first chip ("product 1") may, for example, use all of the categories A to M, while a second chip ("product 2") and a third chip ("product 3") only need some parts of the chip ID register configuration.

In order to simplify a reading operation, a standard test interface is made available for each type of chip, that is to say for each product, so that the various chip ID register configurations of the different chips can all be read with the same test. The result is that testing time is readily saved. However, one drawback is to be seen in the fact that the individual chip ID register configurations on the various chips take up more chip area than would actually be required. Therefore, the same chip area is required for product 2 and product 3 as for product 1, although product 2 only has to store a total of 52 bits and product 3 only has to store 54 bits instead of the 74 bits of product 1, in their respective chip ID register configurations.

FIGS. 2a, 2b and 2c diagrammatically illustrate how chip area can be saved in a chip ID register configuration. Product 1 in FIG. 2a, product 2 in FIG. 2b and product 3 in FIG. 2c are specified herein as examples. In this case, an individual chip ID register configuration is implemented on each chip. It is only the information needed for the respective chip ("product") which is stored in that configuration. Product 1 needs 74 bits and has a correspondingly large chip ID register configuration with a 74-bit shift register. Each category A to M is assigned a respective corresponding number of fuses. For example, category A has four fuses, category B has five fuses, category C has five fuses, etc. (see Table 1).

Products 2 and 3 manage with a substantially smaller chip ID register configuration as compared with product 1, and have a 52-bit shift register (product 2) and a 54-bit shift register (product 3), respectively.

When reading out the conventional chip ID register configuration of the example of FIGS. 2a, 2b and 2c, a clock signal "clock" is input into the shift register and in each case reads out an information content stored in the fuses in the individual shift registers for the products 1 to 3. In that case, each chip or each type of chip must be tested individually, since the individual shift registers contain items of information from different categories in their stages. For example, product 1 contains information from category A in the first stage, while products 2 and 3 have information from categories B and D, respectively, in their first stages. This means that different test interfaces have to be used for the various products in order to ensure that the registers of the various chip ID register configurations can be read out correctly. In other words, product 1 needs a test interface which is based on the fact that all of the categories A to M are stored in the register. However, test interfaces which are needed for product 2 and for product 3 each assume that information from the specified categories is stored in the registers in those products. The chip identification is obtained at an output OUT.

It is therefore possible for chip area to be saved by using a chip ID register configuration based on the principle explained through the use of FIGS. 2a, 2b and 2c. However, that chip ID register configuration has the considerable disadvantage of ruling out the use of a standard test interface and needing different test interfaces for each different type of chips.

FIGS. 3a, 3b and 3c diagrammatically illustrate a chip ID register configuration which permits the use of a standard test interface. In this case, FIG. 3a again shows a chip ID register configuration for product 1, FIG. 3b shows a chip ID register configuration for product 2, and FIG. 3c shows a chip ID register configuration for product 3 from Table 1 given above, each in diagrammatic form.

In the example of FIGS. 3a, 3b and 3c, a standard chip ID register configuration for 74 bits is implemented on each chip, although the number of fuses that is actually integrated depends on the product. This means that product 1 has 74 fuses, while product 2 and product 3 have 52 fuses and 54 fuses, respectively.

On one hand, in the case of product 1, all of the stages of the shift register from category A to category M are respectively assigned fuses, so that in this case there is a total of 74 fuses. On the other hand, product 2 has fuses only in the stages of the shift register which correspond to necessary categories, that is to say in stages B, C, D, etc., while in the stages of the shift register with categories that are not needed, that is to say for example in stages belonging to category A, only an item of defined information is contained, for example "0000", which is indicated by a designation "def" in FIG. 3b.

Therefore, in the case of the chip ID register configuration of FIGS. 3a, 3b and 3c, an equal-sized shift register is always integrated into the individual chips of the various chip types, although a smaller shift register, as in the case of products 2 and 3, would be adequate. In other words, more chip area is occupied in this case than is actually required.

The use of a standard test interface is possible for this purpose, since in the case of categories that are not needed, that is to say for example in the case of category A of product 2, the defined information ("def") is obtained at the output OUT from the chip ID register configuration when the shift register stages in category A are read out.

SUMMARY OF THE INVENTION

It is accordingly an object of the invention to provide a chip ID register configuration, which overcomes the hereinafore-mentioned disadvantages of the heretofore-known devices of this general type and which permits the use of standard test interfaces when reading out, while saving chip area.

With the foregoing and other objects in view there is provided, in accordance with the invention, a chip ID register configuration, comprising a shift register having individual stages. A fuse device connected to the shift register has fuses each substantially assigned to a respective one of the individual stages of the shift register, for identifying a chip having various required and non-required categories. The fuse device stores information from the categories to be read out serially through the shift register to identify the chip. A memory unit stores items of defined information. A logic circuit reads the fuse device for the required category, and reads one of the items of defined information stored in the memory unit for the non-required category, on the basis of the categories of the chip to be identified.

The chip ID register configuration according to the invention therefore combines the advantages of the existing register configurations which are explained above by using FIGS. 2 and 3. Accordingly, in spite of the use of standard test interfaces, it is possible to adapt the chip area needed for the chip ID register configuration in the individual chip types to the actual requirement. For this purpose, in the chip ID register configuration according to the invention, the items of information that are important for the respective chip type or the respective product are stored. In this chip IP register configuration, each fuse and each register stage of the shift register is used. In order to then permit the chip ID register configurations of various chip types or products to be read in the same way, the logic circuit, including a counter and a multiplexer, is additionally integrated into the respective chips. This logic circuit ensures that an item of defined information is read for a category that is not needed. To this end, the multiplexer supplies the output either with the content of the shift register or the item of defined information. A counter, which is controlled by the clock signal, outputs the signals to read the shift register and to control the multiplexer. This counter has been developed specifically for each chip type or each product, but this does not require any great effort.

In summary, the chip ID register configuration according to the invention takes up less chip area than existing register configurations and nevertheless permits the standard testing of different chip types or products with one test interface.

Other features which are considered as characteristic for the invention are set forth in the appended claims.

Although the invention is illustrated and described herein as embodied in a chip ID register configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2a, 2b and 2c are schematic and block diagrams of an example of an existing chip ID register configuration with a reduced chip area, but non-standard test interfaces.

DESCRIPTION OF THE PREFERRED EMBODIMENTS

Figure 1A:
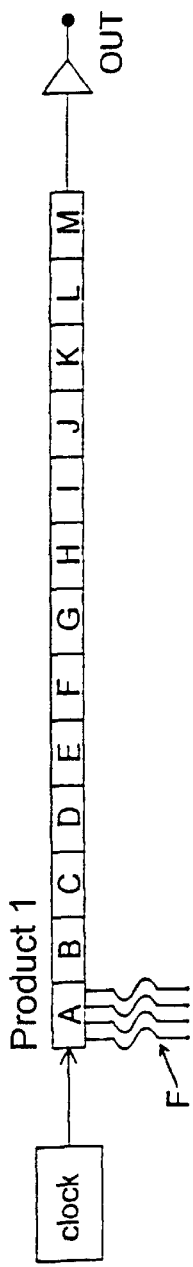
FIGS. 1a, 1b and 1c are schematic and block diagrams of an exemplary embodiment of a chip ID register configuration according to the invention.
Figure 1B:
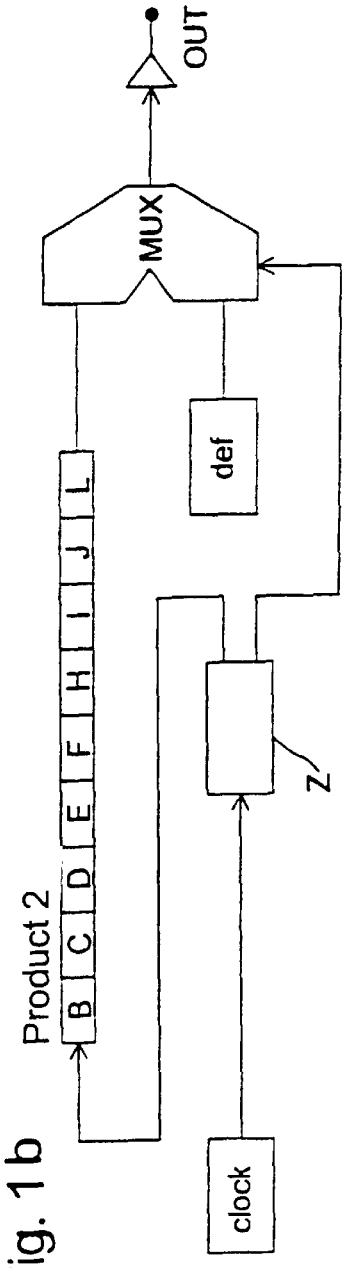
Figure 1C:
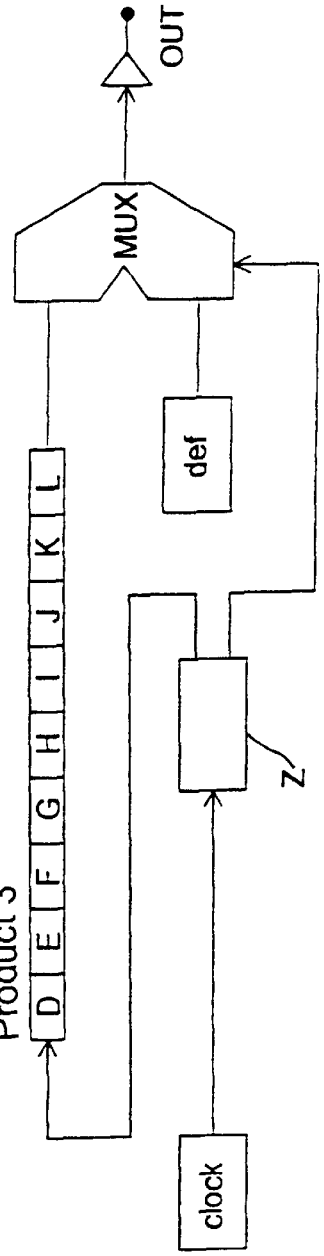

Referring now in detail to FIGS. 1a, 1b and 1c of the drawings, in which the same reference symbols are used as for mutually corresponding components in the other figures, there is seen a diagrammatically illustrated chip ID register configuration according to the invention for a product 1 (FIG. 1a), a product 2 (FIG. 1b) and a product 3 (FIG. 1c) from Table 1.

Figure 3A:
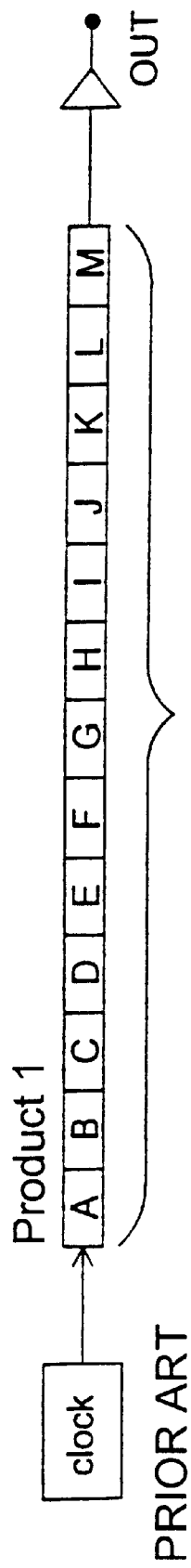
FIGS. 3a, 3b and 3c are schematic and block diagrams of an example of an existing chip ID register configuration with standard test interfaces, but enlarged requisite chip area.
Figure 3B:
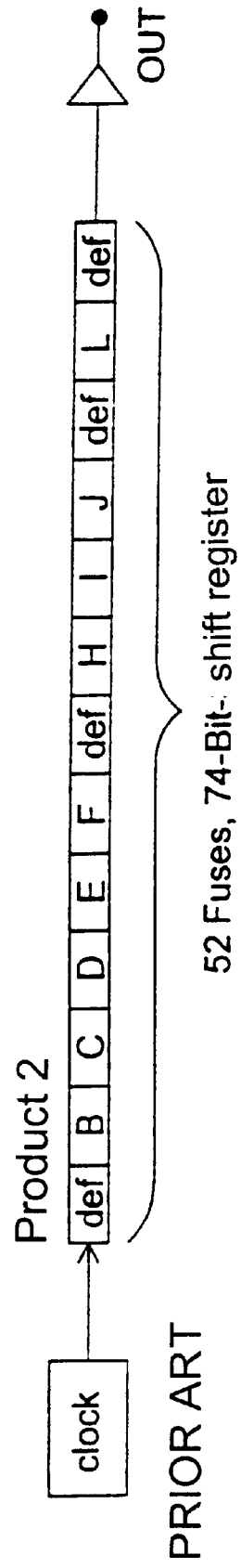
Figure 3C:
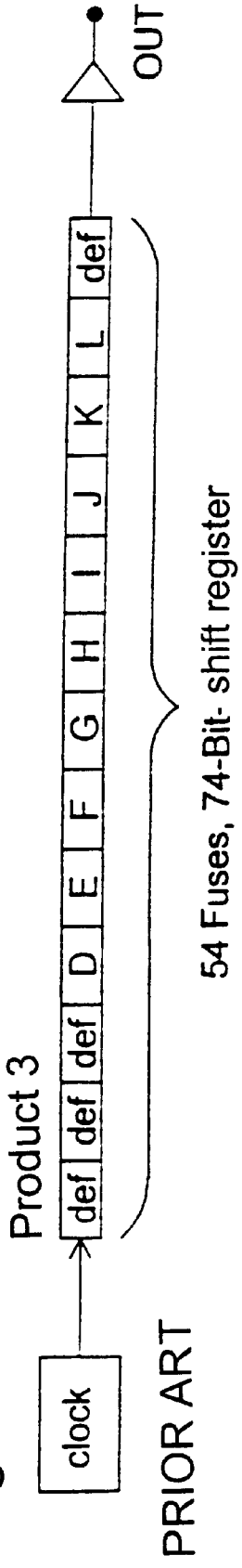

In this case, FIG. 1a corresponds to FIG. 2a and FIG. 3a, respectively. In other words, there is a chip in this case which needs information from all of the categories A to M. This means that a clock signal "clock" corresponding to this item of information is fed into the shift register, in which all of the stages are provided with corresponding fuses F (more precisely: fuse latches). The appropriate ID information from all of the stages of the shift register is then obtained at the output OUT.

In the case of a chip corresponding to product 2, in which 52 bits are needed for identification, the chip ID register configuration according to the invention has a logic circuit including a counter Z and a multiplexer MUX. The multiplexer MUX has one input to which a shift register with register stages corresponding to bits in categories B, C, D, E, F, H, I, J and L, is connected and another input to which an item of defined information "def", which may be stored in a corresponding memory unit and, for example, is "0000", is connected. The clock signal "clock" is fed to the counter Z. The counter Z counts the clock cycles and, in the case of counter readings which correspond to category A, for example, supplies a signal to the multiplexer MUX, so that the latter calls the item of defined information "def" and sends it to the output OUT. On one hand, the same is true of the counter readings corresponding to categories G, K and M. On the other hand, in the case of counter readings corresponding to categories B, C, D, E, F, H, I, J, the information is read from the fuses through the shift register. The multiplexer MUX then forwards the content of the respective stage of the shift register corresponding to these categories B, C, D, E, F, H, I, J, to the output OUT.

In this way, the chip ID register configuration of the exemplary embodiment according to FIG. 1b needs less chip area, since fuses for information bits in categories A, G, K and M can be saved. Nevertheless, a standard test interface can be used, since information corresponding to all of the categories A to M is fed to the output OUT. A connection between the counter Z and the shift register at the same time ensures that the shift register outputs information about the respectively relevant stage to the multiplexer MUX.

The additional outlay for the logic circuit including the counter Z and the multiplexer MUX is low as compared with the chip area saved for register stages that are not used. Therefore, the invention is associated with considerable advantages.

Finally, FIG. 1c further shows an exemplary embodiment with a shift register corresponding to product 3 from the table listed at the beginning. Otherwise, this exemplary embodiment corresponds to the exemplary embodiment of FIG. 1b, with a 54-bit shift register being provided in this case instead of the 52-bit shift register from FIG. 1b.

We claim:

1. A chip ID register configuration, comprising:
   a shift register having individual stages;
   a fuse device connected to said shift register and having fuses each substantially assigned to a respective one of said individual stages of said shift register, for identifying a chip having various required and non-required categories, said fuse device storing information from the categories to be read out serially through said shift register to identify the chip;
   a memory unit storing items of defined information; and
   a logic circuit reading said fuse device for the required category, and reading one of the items of defined information stored in said memory unit for the non-required category, on the basis of the categories of the chip to be identified.

2. The chip ID register configuration according to claim 1, wherein said logic circuit includes a counter and a multiplexer.

3. The chip ID register configuration according to claim 2, wherein said counter has an input receiving a clock signal and an output connected to said multiplexer and to said shift register.

4. The chip ID register configuration according to claim 3, wherein said shift register has an output, and said multiplexer has one input receiving the item of defined information and another input connected to said output of said shift register.

* * * * *